(12) United States Patent
Orr et al.

(10) Patent No.: US 9,697,961 B2
(45) Date of Patent: Jul. 4, 2017

(54) PHOTOVOLTAIC BYPASS SWITCHING

(71) Applicant: Solantro Semiconductor Corp., Ottawa (CA)

(72) Inventors: Raymond Kenneth Orr, Kanata (CA); Antoine Marc Joseph Richard Paquin, Navan (CA)

(73) Assignee: SOLANTRO SEMICONDUCTOR CORP. (CA)

( * ) Notice: Subject to any disclaimer, the term of this patent is extended or adjusted under 35 U.S.C. 154(b) by 884 days.

(21) Appl. No.: 13/840,627

(22) Filed: Mar. 15, 2013

(65) Prior Publication Data
US 2014/0265601 A1    Sep. 18, 2014

(51) Int. Cl.
*H01H 9/00* (2006.01)
*H01L 31/02* (2006.01)
*H02S 50/00* (2014.01)

(52) U.S. Cl.
CPC ......... *H01H 9/00* (2013.01); *H01L 31/02021* (2013.01); *H02S 50/00* (2013.01); *Y02E 10/50* (2013.01); *Y10T 307/696* (2015.04); *Y10T 307/766* (2015.04); *Y10T 307/858* (2015.04)

(58) Field of Classification Search
CPC .............................. H01H 9/00; H01L 27/0266
See application file for complete search history.

(56) References Cited

U.S. PATENT DOCUMENTS

| | | | | |
|---|---|---|---|---|
| 6,271,651 B1 * | 8/2001 | Stratakos | ............... | H02M 3/158 323/282 |
| 7,962,249 B1 * | 6/2011 | Zhang | ..................... | H02J 3/383 307/82 |
| 8,837,098 B2 * | 9/2014 | Victor | ............... | H01L 31/02021 361/42 |

(Continued)

FOREIGN PATENT DOCUMENTS

| | | | | |
|---|---|---|---|---|
| DE | 102011110682 A1 * | 2/2013 | ....... | H01L 31/02021 |
| IT | WO2011128875 A1 | 10/2011 | | |

(Continued)

OTHER PUBLICATIONS

Extended European Search Report issued on Mar. 26, 2015 in respect of European Patent Office Application No. 14159176.8 (6 pages).

(Continued)

*Primary Examiner* — Rexford Barnie
*Assistant Examiner* — Daniel Kessie
(74) *Attorney, Agent, or Firm* — Barnes & Thornburg LLP

(57) ABSTRACT

A PhotoVoltaic (PV) panel bypass switching arrangement includes first and second switches. The first switch is to be coupled between a power system and a first end of a circuit path of the PV panel in which PV cells are connected, and is controllable to connect the first end of the circuit path to a power system and to disconnect the first end of the circuit path from the power system. The second switch is to be coupled between (i) a point between the first switch and the power system and (ii) a point between a second end of the circuit path and the power system, and is controllable to open and close a bypass circuit path that bypasses the circuit path. The first and second switches are controlled based on a determination as to whether the circuit path of the PV panel is to be bypassed.

24 Claims, 13 Drawing Sheets

(56) References Cited

U.S. PATENT DOCUMENTS

| | | | |
|---|---|---|---|
| 9,356,553 B2 | 5/2016 | Augustoni et al. | |
| 2001/0023703 A1 | 9/2001 | Kondo et al. | |
| 2007/0186969 A1* | 8/2007 | Kohler | H01L 31/02008 |
| | | | 136/244 |
| 2008/0164766 A1* | 7/2008 | Adest | H02J 1/12 |
| | | | 307/80 |
| 2009/0207543 A1 | 8/2009 | Boniface et al. | |
| 2010/0002349 A1 | 1/2010 | La Scala et al. | |
| 2010/0071742 A1 | 3/2010 | de Rooij et al. | |
| 2010/0288327 A1 | 11/2010 | Lisi et al. | |
| 2011/0278955 A1 | 11/2011 | Signorelli et al. | |
| 2012/0025617 A1 | 2/2012 | Mateicka | |
| 2012/0049879 A1 | 3/2012 | Crites | |
| 2012/0161527 A1 | 6/2012 | Casey | |
| 2012/0163048 A1* | 6/2012 | Victor | H02H 3/16 |
| | | | 363/55 |
| 2012/0173031 A1 | 7/2012 | Parameswaran et al. | |
| 2012/0194003 A1* | 8/2012 | Schmidt | H01L 31/02021 |
| | | | 307/116 |
| 2012/0235687 A1 | 9/2012 | Abe et al. | |
| 2012/0306289 A1 | 12/2012 | Pozsgay | |
| 2012/0313455 A1* | 12/2012 | Latham | H01L 31/02021 |
| | | | 307/117 |
| 2013/0009483 A1 | 1/2013 | Kawate et al. | |
| 2013/0038129 A1 | 2/2013 | Bundschuh et al. | |
| 2013/0057989 A1* | 3/2013 | Victor | H01L 31/02021 |
| | | | 361/42 |
| 2013/0241297 A1* | 9/2013 | Falk | H02J 3/383 |
| | | | 307/80 |
| 2014/0001865 A1* | 1/2014 | Osterloh | H01L 31/02021 |
| | | | 307/77 |
| 2014/0373894 A1* | 12/2014 | Stratakos | H02S 50/00 |
| | | | 136/244 |

FOREIGN PATENT DOCUMENTS

| | | |
|---|---|---|
| JP | WO2013018794 A1 | 2/2013 |
| WO | 2010078303 | 7/2010 |
| WO | 2012079742 | 6/2012 |

OTHER PUBLICATIONS

Solar fire and theft protection, Mar. 14, 2013, Photovoltaic news and pv jobs, www.pv-magazine.com/news/details/beitrag/solar-fire-and-theft-protection__100010.

Extended European Search Report issued on Mar. 25, 2015 in respect of European Patent Office Application No. 14159173.5 (5 pages).

U.S. Office Action issued on Nov. 19, 2015 in respect of U.S. Appl. No. 13/840,162 (42 pages including Notice of References Cited).

U.S. Final Office Action issued on Jun. 6, 2016 in respect of U.S. Appl. No. 13/840,162 (9 pages).

* cited by examiner

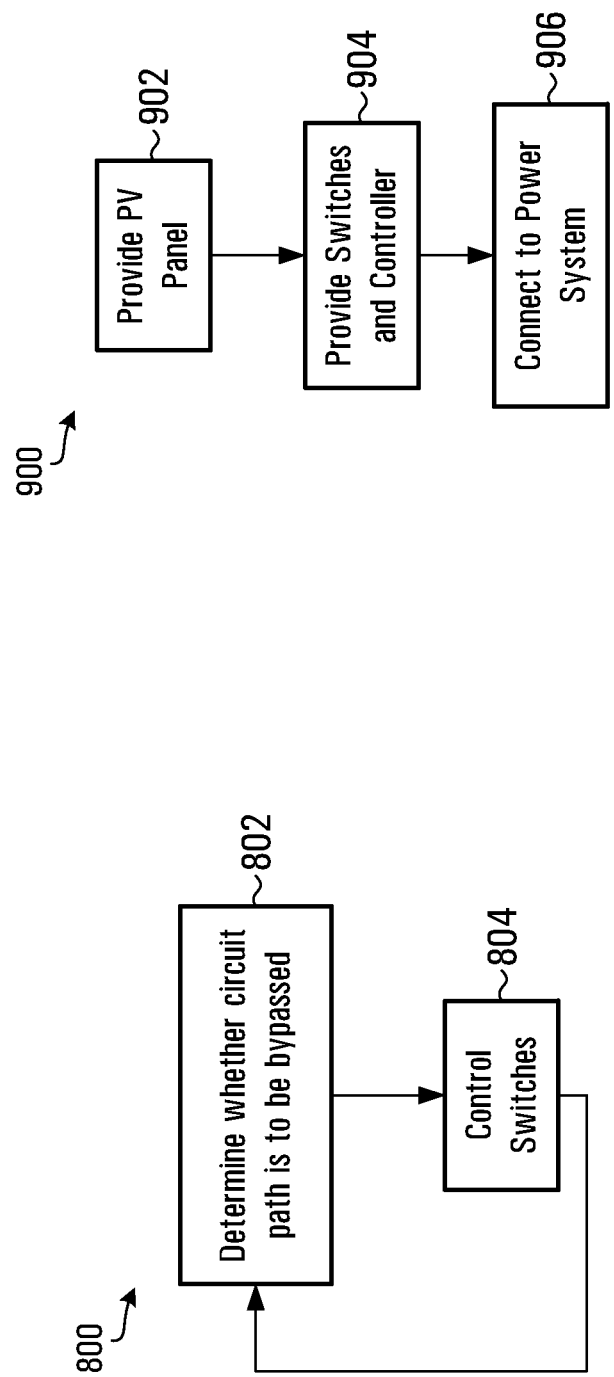

PHOTOVOLTAIC BYPASS SWITCHING

FIELD OF THE INVENTION

This invention relates generally to PhotoVoltaic (PV) panels and in particular, to improving their tolerance to shading or reduced insolation.

BACKGROUND

PhotoVoltaic (PV) solar panels are an important source of power for the electrical grid. Large, megawatt PV installations with PV panels numbering in the tens of thousands are increasingly common. PV panel arrays are typically organized into panel "strings" with each string consisting of from 10 to 20 PV panels connected in series. In a Direct Current (DC) PV panel system, the output of a PV panel string could connect to a central inverter which converts the DC power of the PV panels into AC power suitable for the electrical grid. Typical PV panel string voltages at the inverter input may range from 500 V to 1000V.

A typical PV panel is organized as a series connection of individual PV cells. A common configuration is 72 PV cells per panel. A typical PV cell operating voltage under illumination is about 0.7 V. An illuminated 72 PV cell panel will therefore have an output voltage of about 50 volts DC.

A known problem of connecting PV panels and PV cells in series is uneven photocurrents produced by individual PV cells. Uneven photocurrents may be caused by one or more of: shading of a particular PV cell or group of PV cells in a PV panel, shading of an entire PV panel in a multi-panel system, soiling of a portion of a PV panel or an entire PV panel in a multi-panel system, differences in PV panel orientation relative to the illumination source, and PV cell/panel manufacturing variations. Since all PV cells in a PV panel are series connected, the current output of the PV panel is limited by the PV cell with the lowest photocurrent. In the case of a heavily shaded PV cell, a large reverse bias voltage may be generated across it by the remaining unshaded PV cells, forcing current through the shaded PV cell. This reverse bias voltage may become large enough to cause a catastrophic breakdown of the PV cell and create permanent damage.

A common solution to this problem is to add anti-parallel bypass diodes in parallel with groups of PV cells. A common arrangement for a 72 PV cell panel is to have three "sub-strings" of 24 PV cells each, with one bypass diode per sub-string.

Bypass diodes prevent formation of high reverse bias voltages. The bypass diode is normally reverse biased. However, when a portion of the PV cells in a sub-string become sufficiently shaded, for example, the bypass diode will become forward biased and conduct the photocurrent of the remaining unshaded sub-strings, preventing damage to the PV cells in the shaded or partially shaded sub-string.

Bypass diodes have a number of disadvantages. For instance, they are prone to failure. If the failure is an open circuit failure, then the bypass diode's PV cell sub-string is no longer protected and the PV panel may suffer catastrophic failure. If the bypass diode failure is a short circuit failure, then the PV cell sub-string to which the failed diode is attached will not produce useful power. Another disadvantage of bypass diodes is their power dissipation. Bypass diodes decrease PV panel efficiency by consuming power whenever they become forward biased. A bypass diode has a forward bias voltage of about 0.7 V. With a typical PV panel current of 8 A, each forward biased bypass diode dissipates 5.6 W. If a PV panel that includes three PV cell sub-strings and three bypass diodes were heavily shaded and its three bypass diodes were to become forward biased, then the fully bypassed PV panel would actually represent a load, dissipating 16.8 W. With one and two PV cell sub-strings bypassed, the forward biased bypass diode(s) would reduce the power output of this example PV panel by 5.6 W and 11.2 W respectively.

SUMMARY

A PV panel bypass switching arrangement includes a first switch to be coupled between a power system and a first end of a circuit path of the PV panel in which a plurality of PV cells of the PV panel are connected, the first switch being controllable to connect the first end of the circuit path of the PV panel to a power system and to disconnect the first end of the circuit path of the PV panel from the power system; a second switch to be coupled between (i) a point between the first switch and the power system and (ii) a point between a second end of the circuit path of the PV panel and the power system, the second switch being controllable to open and close a bypass circuit path that bypasses the circuit path of the PV panel; a controller operatively coupled to the first switch and to the second switch, to determine whether the circuit path of the PV panel is to be bypassed, and to control the first and second switches based on the determination.

In an embodiment, the PV panel bypass switching arrangement also includes a voltage sensor, to be coupled to measure a voltage difference across PV cells in the circuit path of the PV panel. The controller is coupled to the voltage sensor to determine whether the circuit path of the PV panel is to be bypassed based on the voltage difference measured by the voltmeter.

The PV panel bypass switching arrangement could include a voltage sensor, to be switchably coupled between respective pairs of voltage measuring points in the circuit path of the PV panel between which respective sub-strings of the plurality of PV cells are connected, to measure respective voltage differences between the respective voltage measuring points. The controller is coupled to the voltage sensor to determine whether the circuit path of the PV panel is to be bypassed based on the voltage differences measured by the voltage sensor.

The PV panel bypass switching arrangement might also include respective PV cell sub-string switches to be coupled across the respective PV cell sub-strings. The controller could then be operatively coupled to the PV cell sub-string switches, to determine whether each respective PV cell sub-string in the circuit path of the PV panel is to be bypassed, and to control the PV cell sub-string switches based on the determination of whether each PV cell sub-string in the circuit path of the PV panel is to be bypassed.

In an embodiment, the PV panel bypass switching arrangement includes a power connection between the controller and the PV panel, to provide power to the controller from the PV panel, and the power connection includes a voltage stabilization circuit. The voltage stabilization circuit could include a diode, an anode of the diode being coupled to the PV panel and a cathode of the diode being coupled to a power input of the controller; a capacitor to couple the cathode of the diode to the second end of the circuit path of the PV panel.

The controller could be configured to further determine, subsequent to determining that the circuit path of the PV panel is to be bypassed, whether the PV panel is to be reconnected to the power system, and to further control the first and second switches based on the further determination.

For instance, the controller could be configured to open the first switch and close the second switch responsive to determining that the circuit path of the PV panel is to be bypassed. The controller could then be further configured to subsequently close the first switch and open the second switch, to further determine whether the PV panel is to be reconnected to the power system based on the voltage differences measured by the voltage sensor while the first switch is closed and the second switch is open, and to control the first and second switches based on the further determination. In another embodiment, the controller is further configured to subsequently determine whether the PV panel is to be reconnected to the power system based on a voltage difference across the second switch while the second switch is closed, and to control the first and second switches based on the determination of whether the PV panel is to be reconnected to the power system.

The controller could also or instead be configured to, responsive to determining that a PV cell sub-string in the circuit path of the PV panel is to be bypassed, close the PV cell sub-string switch that is coupled across the PV cell sub-string, The controller could then be further configured to determine, subsequent to determining that the PV cell sub-string is to be bypassed, whether the PV cell sub-string is to be reconnected based on a voltage difference across the PV cell sub-string switch while the PV cell sub-string switch is closed, and to control the PV cell sub-string switch of the PV cell sub-string based on the determination of whether the PV cell sub-string is to be reconnected. The controller could instead be further configured to subsequently open the PV cell sub-string switch, to further determine whether the PV cell sub-string is to be reconnected based on the voltage difference measured across the PV cell sub-string by the voltage sensor while PV cell sub-string switch is open, and to control the PV cell sub-string switch of the PV cell sub-string based on the determination of whether the PV cell sub-string is to be reconnected.

A PV panel system could include such a PV panel bypass switching arrangement; a PV panel including the plurality of PV cells connected in the circuit path.

A power system could include a plurality of such PV panel systems.

A method includes determining whether a circuit path of a PhotoVoltaic (PV) panel, in which a plurality of PV cells of the PV panel are connected, is to be bypassed; controlling a first switch coupled between a power system and a first end of the circuit path of the PV panel, to connect the first end of the circuit path of the PV panel to a power system or to disconnect the first end of the circuit path of the PV panel from the power system, based on the determination; controlling a second switch coupled between (i) a point between the first switch and the power system and (ii) a point between a second end of the circuit path of the PV panel and the power system, to open or close a bypass circuit path that bypasses the circuit path of the PV panel, based on the determination.

The method could also include measuring a voltage difference across PV cells in the circuit path of the PV panel, in which case the determining might include determining whether the circuit path of the PV panel is to be bypassed based on the measured voltage difference.

In an embodiment, the method also includes measuring respective voltage differences across respective sub-strings of the plurality of PV cells in the circuit path of the PV panel.

The determining could then involve determining whether the circuit path of the PV panel is to be bypassed based on the measured voltage differences.

The method could include determining whether each respective PV cell sub-string in the circuit path of the PV panel is to be bypassed; controlling respective PV cell sub-string switches coupled across the respective PV cell sub-strings, based on the determination of whether each PV cell sub-string in the circuit path of the PV panel is to be bypassed.

Power could be provided to a controller from the PV panel, in which case the method could include stabilizing a voltage that is provided to power the controller.

The stabilizing could involve providing a stabilization circuit comprising: a diode, an anode of the diode being coupled to the PV panel and a cathode of the diode being coupled to a power input of the controller; and a capacitor to couple the cathode of the diode to the second end of the circuit path of the PV panel; opening the first switch and closing the second switch when the capacitor discharges to a first voltage; closing the first switch and opening the second switch when the capacitor charges to a second voltage above the first voltage.

The method could also include determining, subsequent to determining that the circuit path of the PV panel is to be bypassed, whether the PV panel is to be reconnected to the power system; further controlling the first and second switches based on the determination of whether the PV panel is to be reconnected to the power system.

Where the controlling of the first switch involves opening the first switch responsive to determining that the circuit path of the PV panel is to be bypassed and the controlling of the second switch involves closing the second switch responsive to determining that the circuit path of the PV panel is to be bypassed, the method could also include subsequently closing the first switch and opening the second switch; determining whether the PV panel is to be reconnected to the power system based on the voltage differences measured while the first switch is closed and the second switch is open; controlling the first and second switches based on the determination of whether the PV panel is to be reconnected to the power system.

In another embodiment of reconnection, the method involves subsequently determining whether the PV panel is to be reconnected to the power system based on a voltage difference across the second switch while the second switch is closed; controlling the first and second switches based on the determination of whether the PV panel is to be reconnected to the power system.

For PV cell sub-strings, the controlling of the respective PV cell sub-string switches could involve, responsive to determining that a PV cell sub-string in the circuit path of the PV panel is to be bypassed, closing the PV cell sub-string switch that is coupled across the PV cell sub-string. The method could then also involve subsequently determining whether the PV cell sub-string is to be reconnected based on a voltage difference across the PV cell sub-string switch while the PV cell sub-string switch is closed; controlling the PV cell sub-string switch of the PV cell sub-string based on the determination of whether the PV cell sub-string is to be reconnected. In another embodiment, the method includes subsequently opening the PV cell sub-string switch; determining whether the PV cell sub-string is to be reconnected to the power system based on the voltage difference measured across the PV cell sub-string while the PV cell sub-string switch is open; controlling the PV cell sub-string switch based on the determination of whether the PV cell sub-string is to be reconnected.

Another method includes providing a PV panel comprising a circuit path in which a plurality of PV cells are connected; providing a first switch to switchably connect a first end of the circuit path of the PV panel to a power system; providing a second switch to switchably connect (i) a point between the first switch and the power system and (ii) a point between a second end of the circuit path of the PV panel and the power system; providing a controller to determine whether the circuit path of the PV panel is to be bypassed and to control the first and second switches based on the determination.

BRIEF DESCRIPTION OF THE DRAWINGS

FIG. 8 is a flow diagram of an example method.

FIG. 9 is a flow diagram of another example method.

DETAILED DESCRIPTION

Figure 1:
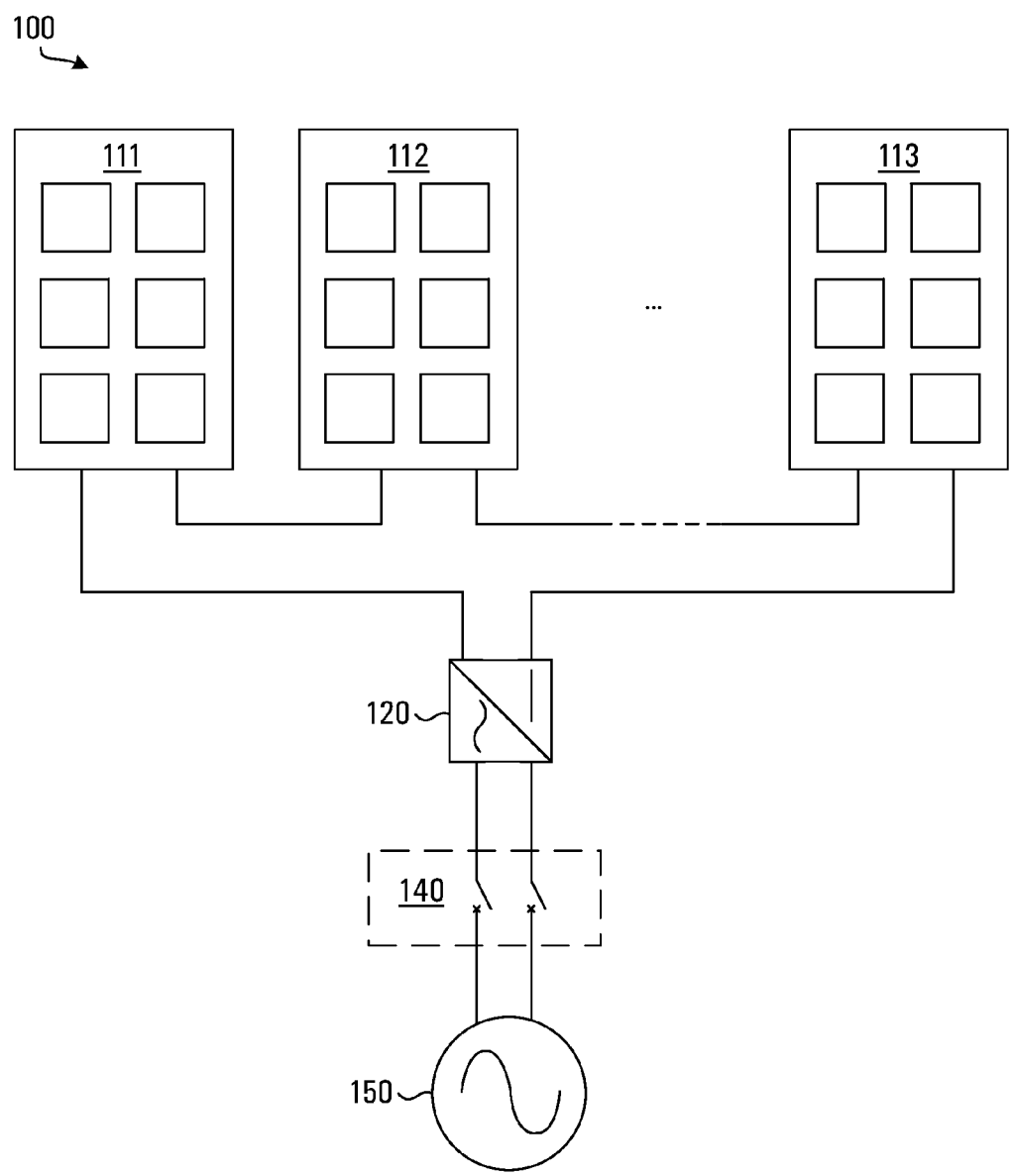
FIG. 1 is a block diagram of an example PV installation.

FIG. 1 is a block diagram of an example PV installation, tied to an electrical grid. The example installation 100 consists of DC PV panels 111, 112, 113, which are series connected between DC inputs of a central inverter 120. The output of the inverter 120 connects to the electrical grid 150 through a disconnect switch 140.

Figure 2:
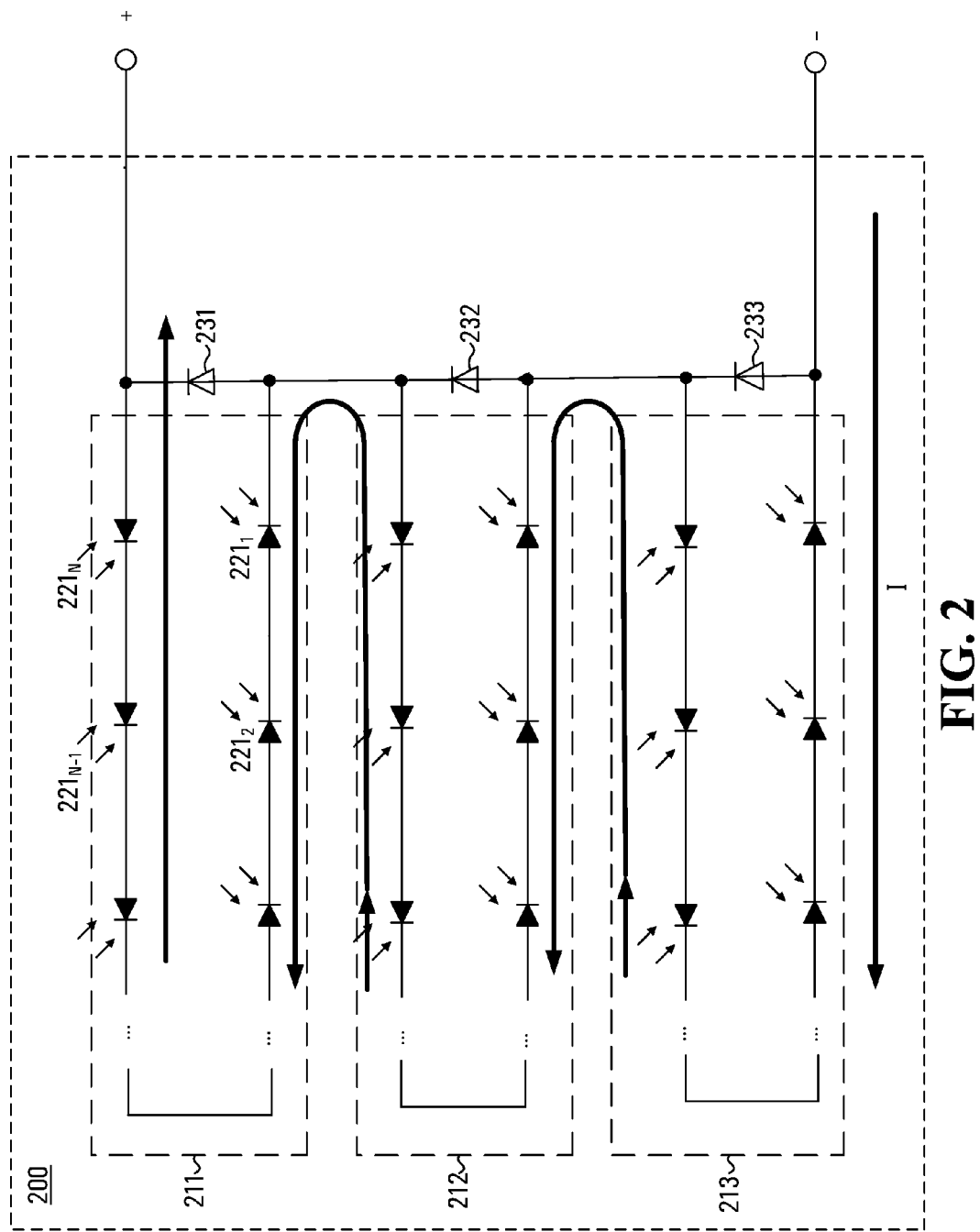
FIG. 2 is a schematic diagram of an example PV panel

FIG. 2 is a schematic diagram of an example PV panel. The example PV panel 200 consists of PV cell sub-strings, 211, 212, 213. Each PV cell sub-string consists of a series connection of N PV cells. In parallel with each PV cell sub-string is a bypass diode 231, 232, 233. Sub-string 211 consists of photocells $221_1, 221_2, \ldots, 221_{N-1}, 221_N$ and is in parallel with bypass diode 231. The PV cell sub-strings 211, 212, 213 are in series with one another. Although this example PV panel 200 has three sub-strings 211, 212, 213, PV panels with fewer or larger numbers of sub-strings are possible.

In normal operation without shading, soiling or large manufacturing variations, all the bypass diodes 231, 232, 233 are reverse biased and current I flows through the PV cells as shown in FIG. 2.

Figure 3:
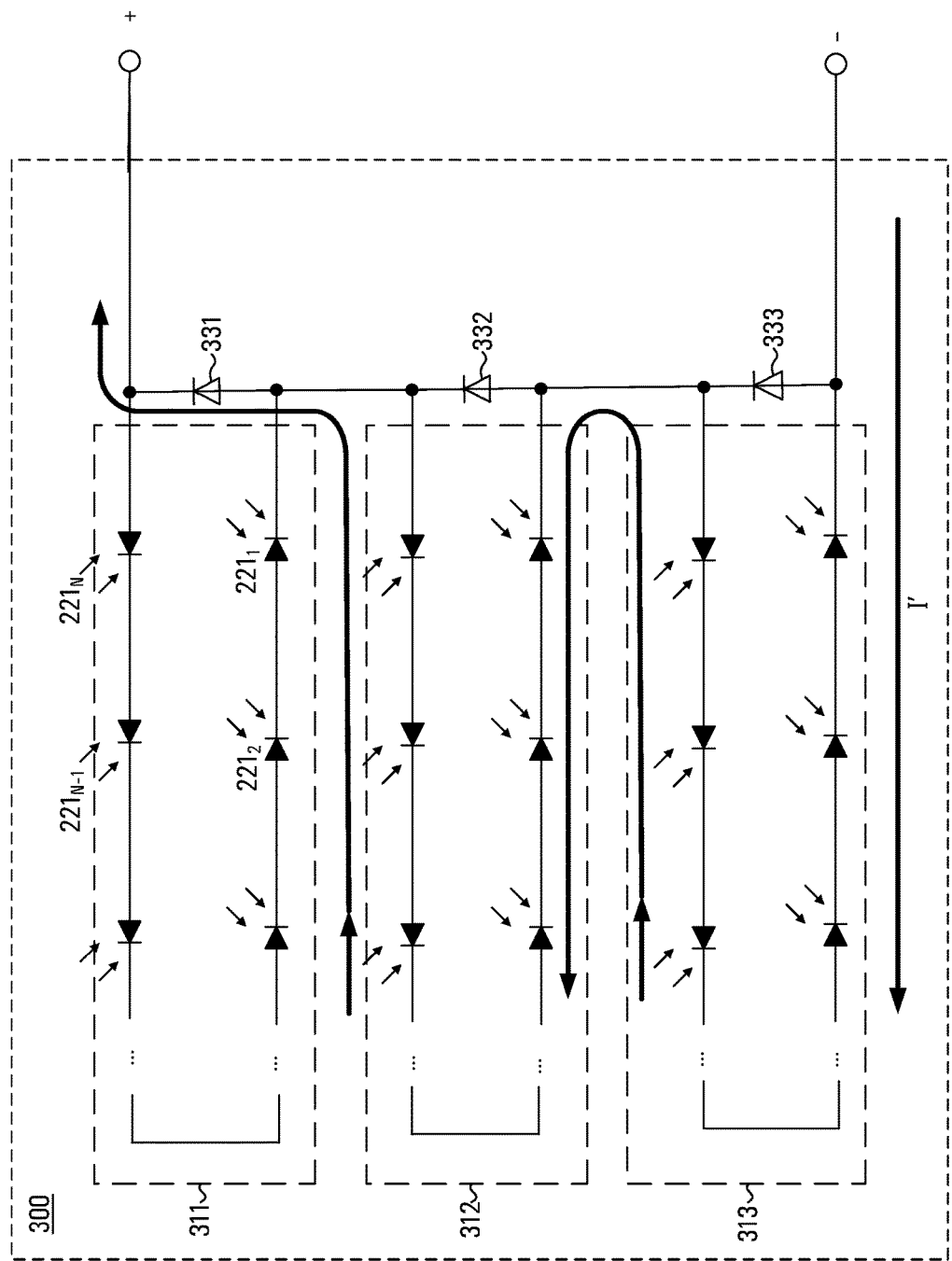
FIG. 3 is a schematic diagram showing current flow in an example PV panel with one bypassed PV cell sub-string.

FIG. 3 is a schematic diagram showing current flow in an example PV panel with one bypassed sub-string 311 (due to shading, for example). The example PV panel 300 has the same structure as the example PV panel 200 in FIG. 2, with three sub-strings 311, 312, 313 of PV cells and three bypass diodes 331, 332, 333. However, FIG. 3 illustrates a different current flow than FIG. 2.

In FIG. 3, the sub-string 311 has a lower photocurrent, due to shading for example, and the bypass diode 331 is forward biased. The PV panel photocurrent I' passes through the sub-strings 312 and 313 and the bypass diode 331.

Figure 4A:
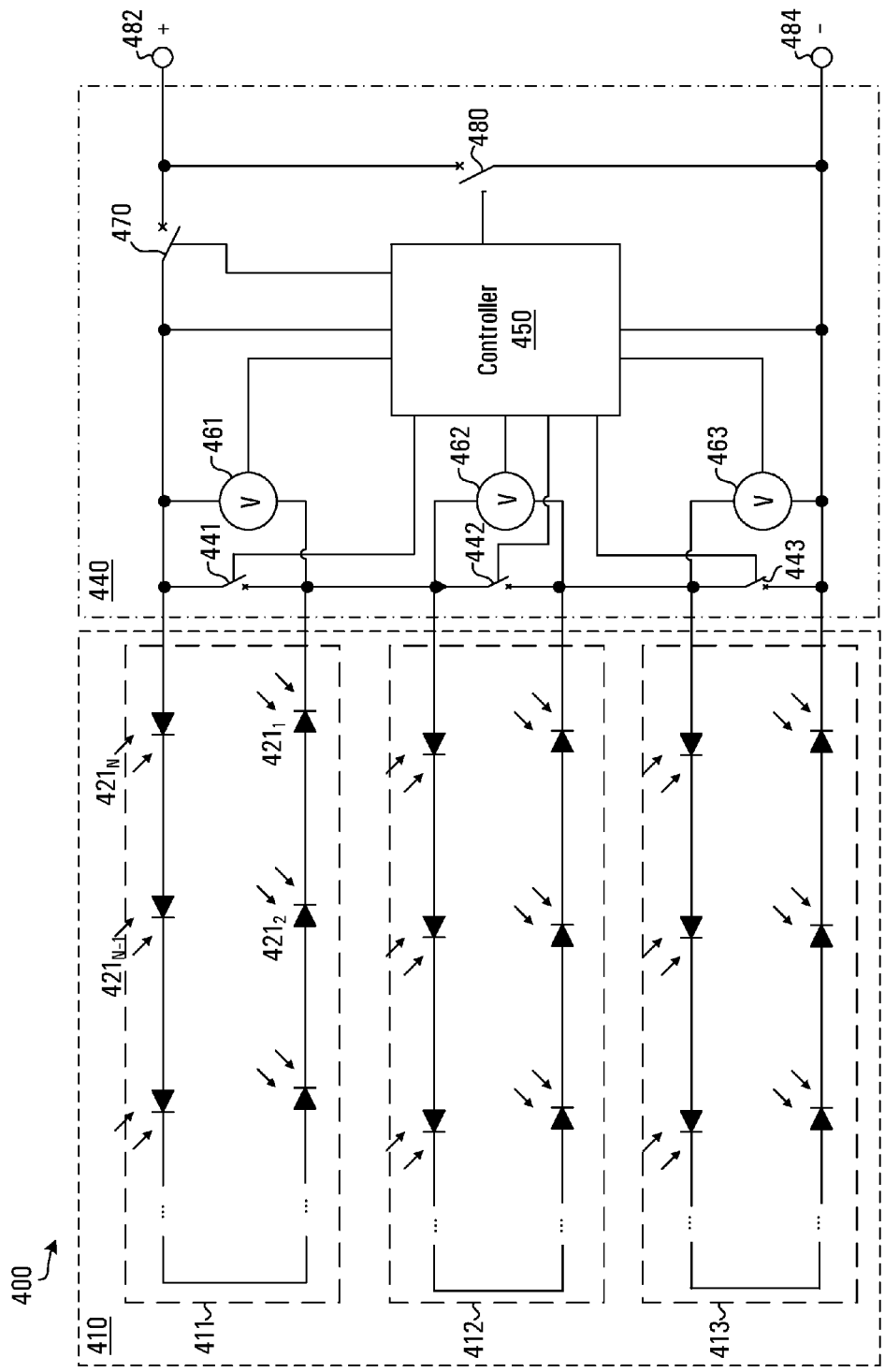
FIG. 4A is a schematic diagram of an example PV panel system.

As noted above, bypass diodes have disadvantages. FIG. 4A is a schematic diagram of an example PV panel system 400, which includes a PV panel 410 and a bypass switching arrangement 440. The bypass switching arrangement 440 incorporates bypass diode functionality and is designed for the example PV panel 410, which has three PV cell sub-strings 411, 412, 413 in the example shown. Each sub-string 411, 412, 413 has N PV cells, labelled $421_1, 421_2, \ldots, 421_{N-1}, 421_N$ for the sub-string 411. Other numbers of sub-strings are contemplated.

Sub-string bypass switches 441, 442, 443 are coupled across or between ends of (i.e., in parallel with) their respective sub-strings 411, 412, 413. Sub-string voltages $V_{SS,1}$, $V_{SS,2}$ and $V_{SS,3}$ are measured by respective voltage sensors 461, 462, 463, illustratively voltmeters, and the measured voltage values are received by a controller 450. The controller 450 controls the operation of sub-string bypass switches 441, 442, 443, as well as a PV panel shunt switch 480 and a PV panel series switch 470. The sub-string bypass switches 441, 442, 443, and the PV panel series and shunt switches 470, 480, may be implemented using any of a variety of means, including power Metal Oxide Semiconductor Field Effect Transistors (MOSFETS), Insulated Gate Bipolar Transistors (IGBTs), Thyristors, and/or relays, for example.

482, 484 in FIG. 4A represent terminals through which a circuit path of the PV panel 410, in which the PV cells are connected, may connect to a power system. Such a power system could include multiple PV panel systems such as the example PV panel system 400.

In normal operation, when all PV panels in a string are producing substantially the same current, the sub-string bypass switches 441, 442, 443 are open, the panel shunt switch 480 is open, and the panel series switch 470 is closed. String current flows through the PV cell sub-strings 411, 412, 413 and the panel series switch 470. The PV panel 410 is in series with other PV panels in the panel string and contributes to the string voltage and current.

The controller 450 monitors measured values of the sub-string voltages received from the voltage sensors 461, 462, 463. On detection of a low voltage on a sub-string due to, for example, shading, the controller 450 closes that sub-string's bypass switch 441, 442, 443. In FIG. 4A for example, if the voltage difference across the sub-string 411 is low, then the controller 450 closes the bypass switch 441, shunting current around the sub-string and preventing the creation of harmful reverse voltages. The on-resistance of a MOSFET switch, for example, can be in the single milliohm (mΩ) range. Thus, the power dissipation of a MOSFET switch as the bypass switch 441 could be significantly lower than the power dissipation of a conventional bypass diode. For example, with a string current of 8 A and a MOSFET switch on-resistance of 1 ma, the power dissipation of the switch is only 64 mW, compared with bypass diode power dissipation of 5.6 W noted above under the same 8 A string current condition.

In one embodiment, the controller 450 closes a sub-string bypass switch 441, 442, 443 when the sub-string voltage across its connected sub-string 411, 412, 413 decreases below a certain sub-string shunt threshold value ($V_{SUB\_SH}$). In one embodiment, the value of $V_{SUB\_SH}$ is zero volts. In another embodiment, the controller 450 closes a sub-string bypass switch 441, 442, 443 when the sub-string voltage remains below a threshold value for longer than a specified time interval.

Sub-String Unshunting

After a sub-string 411, 412, 413 has been bypassed by closing its bypass switch 441, 442, 443, the controller 450 may periodically check to determine whether the sub-string should be unshunted. For example, the illumination of a shunted or bypassed sub-string may have changed sufficiently for it to be unshunted, which the controller 450 could determine from one or more of the voltages measured by the voltage sensors 461, 462, 463. In one embodiment of sub-string unshunting, the controller 450 periodically opens the previously closed sub-string bypass switch 441, 442, 443, and receives a measured sub-string voltage from a voltage sensor 461, 462, 463. In one embodiment, if the measured voltage has risen to above $V_{SUB\_SH}$, then the controller 450 keeps the sub-string bypass switch 441, 442, 443 open, and otherwise it recloses the bypass switch.

In another embodiment of sub-string unshunting, the controller 450 determines the voltage across the closed sub-string bypass switch 441, 442, 443. If the voltage is greater than a threshold value, then the controller 450 unshunts the sub-string by opening the sub-string bypass switch 441, 442, 443.

Figure 4B:
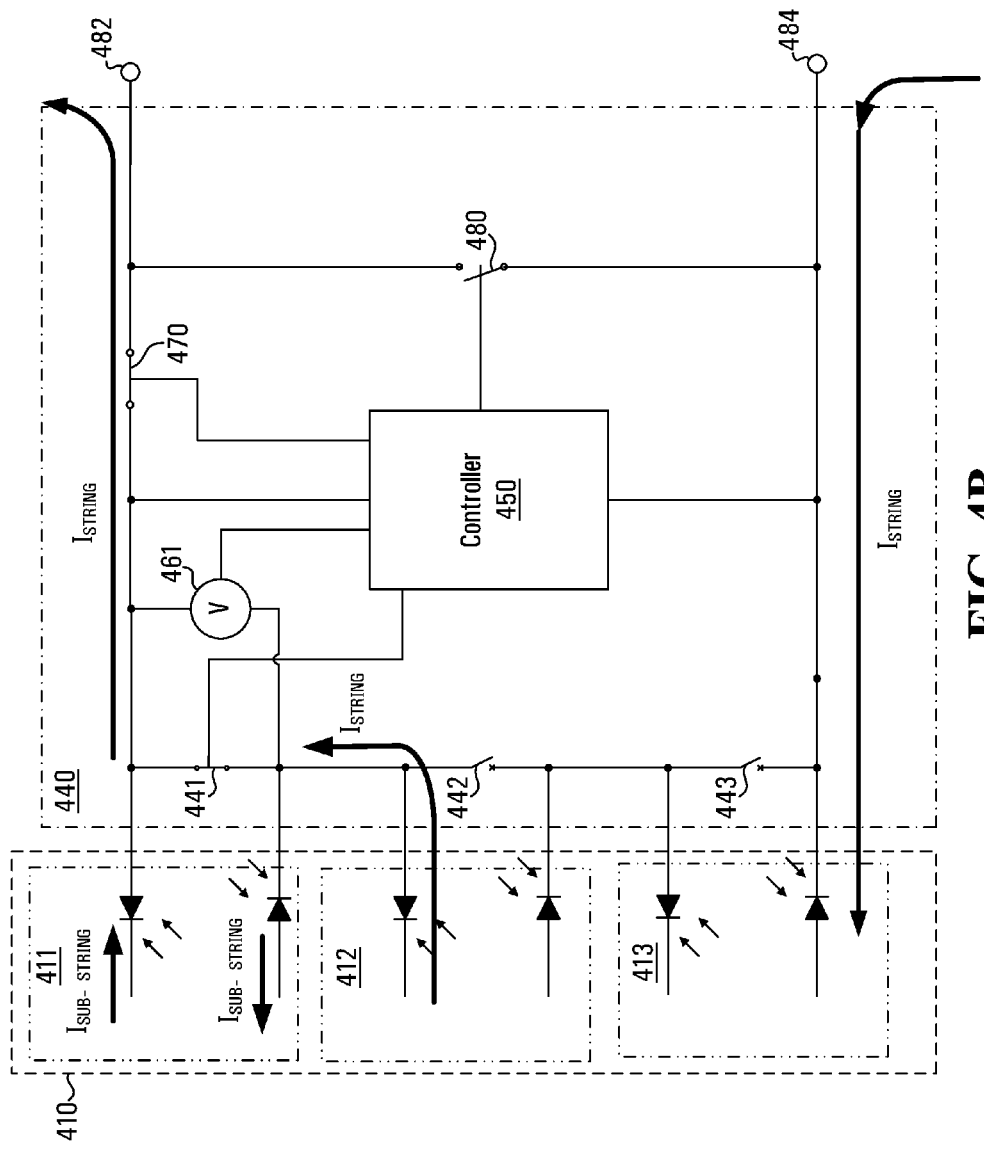
FIG. 4B is a schematic diagram showing the string current and sub-string currents flowing in an example PV panel system.

FIG. 4B is a schematic diagram showing the string current and sub-string currents flowing in an example PV panel system. PV panel 410 connects to a power system (not shown) through terminals 482, 484. PV panel bypass switch 480 is open and panel series switch 470 is closed, allowing string current $I_{STRING}$ to flow through the PV panel. Sub-string bypass switch 441 is closed, shunting sub-string 411. The remaining sub-string bypass switches 442, 443 are open and their respective sub-strings 412, 413 are unshunted. FIG. 4B relates to an example in which the sub-string 411 is shunted, and therefore only the voltage sensor 461 is shown for the purposes of this particular example.

The current flowing in closed sub-string bypass switch 441 is the difference between the string current $I_{STRING}$ and the sub-string current $I_{SUB-STRING}$ of sub-string 411. The voltage across switch 441 is measured by voltage sensor 461. When the voltage across sub-string shunt switch 441 is less than zero, this indicates that the string current is greater than the sub-string current. When the voltage across sub-string shunt switch 441 is zero, this indicates that the string current and the sub-string current are equal. When the voltage across sub-string shunt switch 441 is positive, this indicates that the sub-string current is larger than string current. With sub-string bypass switch 441 closed, the sub-string current of sub-string 411 is substantially equal to its short circuit current. The corresponding sub-string voltage at the short circuit current is zero. Thus, in one embodiment, the controller 450 opens sub-string bypass switch 441 and unshunts the PV sub-string 411 when the voltage across sub-string shunt switch 441 is greater than zero. Under these conditions, the sub-string voltage across the unshunted PV sub-string 411 will be greater than zero and the sub-string will contribute power to the power system.

Full PV Panel Bypass

The above sub-string bypass operation is suitable for bypassing up to two of the three sub-strings 411, 412, 413 in the example PV panel 410. Bypassing all of the sub-strings in a PV panel using sub-string bypass switches could be an issue where the controller 450 receives power for its operation from the PV panel 410. In the event that a low voltage were detected across all three sub-strings 411, 412, 413 in the example PV panel 410 and the bypass switches 441, 442, 443 were all to be closed, the controller 450 would not be powered and would be unable to provide drive voltages to operate any of the bypass switches.

In one embodiment, if the sum of the sub-string voltages as measured by the voltage sensors 461, 462, 463 is below a threshold value ($V_{P\_SH}$), then the controller 450 closes the panel shunt switch 480 and opens the panel series switch 470 and the sub-string bypass switches 441, 442, 443 to completely shunt the PV panel 410. In one embodiment, $V_{P\_SH}$ corresponds to a minimum operating voltage of the controller 450.

Figure 4C:
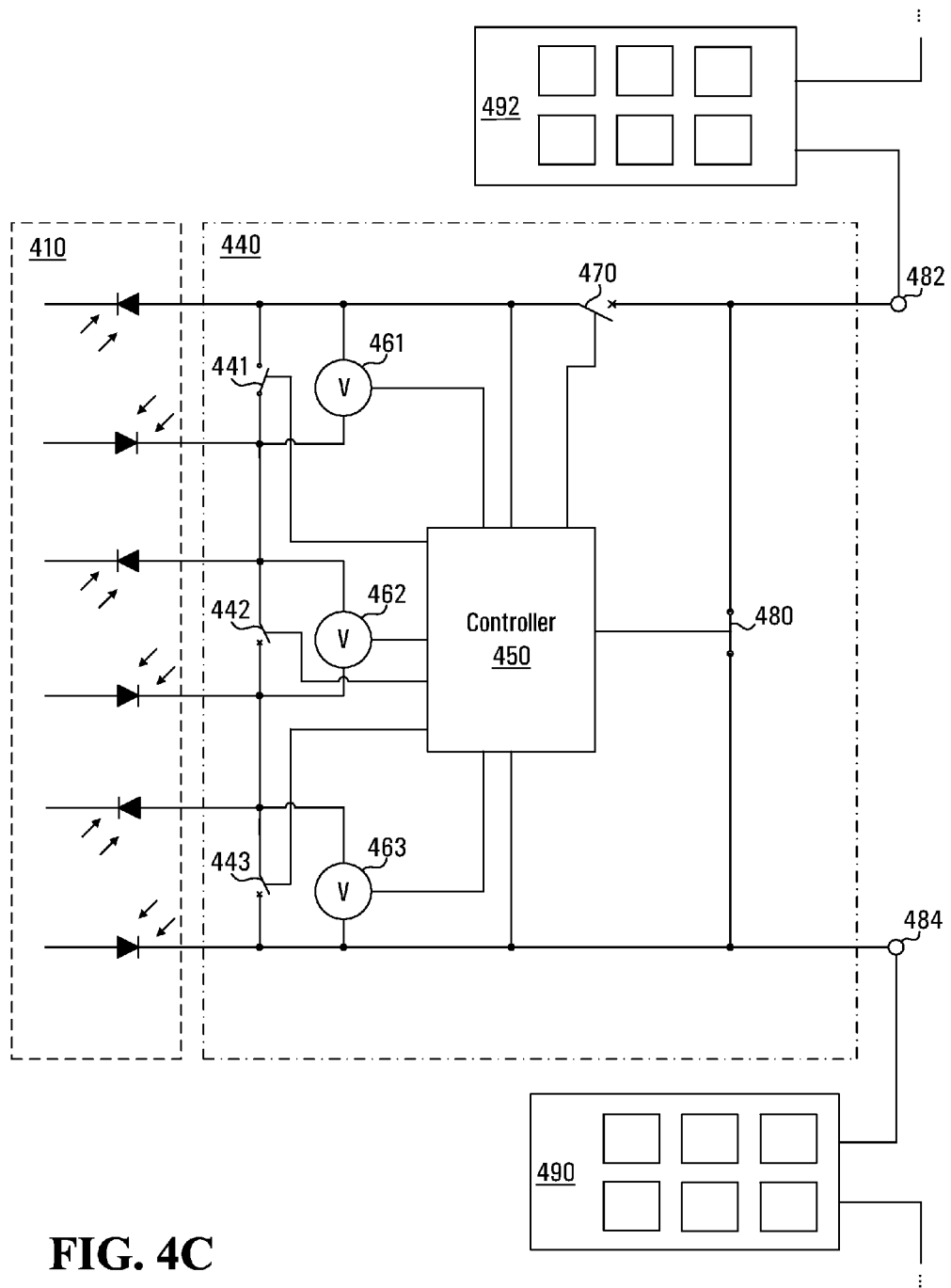
FIG. 4C is a schematic diagram showing shunting of a PV panel in an example power system.

FIG. 4C is a schematic diagram showing complete shunting of a PV panel in an example power system. In this embodiment, the example PV panel 410 is isolated from the terminals 482, 484 and thus from other PV panels 490, 492 in a power system PV panel string by the open panel series switch 470. The string current produced by the PV panels 490, 492 runs through closed panel shunt switch 480 and not through the PV panel 410. Sub-string bypass switches 441, 442, 443 are all open. The voltage across the PV panel 410 circuit path in which the PV cells are connected can rise sufficiently to power the controller 450 for its operation even when the PV panel is weakly illuminated.

In this type of bypass switching architecture and control, the string current only flows through one bypass switch (switch 480 in FIG. 4C) rather than a series connection of sub-string bypass switches 441, 442, 443. This can reduce power dissipation.

PV Panel Unshunting

After a PV panel has been completely shunted, the controller 450 could periodically check to determine whether the PV panel should be unshunted, as a result of a change in illumination for instance. In one embodiment of this type of "wake-up" operation, the controller 450 periodically opens the panel shunt switch 480, closes the panel series switch 470, and receives measurements of the sub-string voltages from the voltage sensors 461, 462, 463 to determine whether the PV panel 410 should still be bypassed.

If the sum of the sub-string voltages is below the PV panel shunt or bypass threshold value ($V_{P\_SH}$), then the controller 450 recloses panel shunt switch 480 and reopens panel series switch 470. If the sum of the sub-string voltages is above the bypass threshold value ($V_{P\_SH}$), then the panel shunt switch 480 remains open and the panel series switch 470 remains closed. The controller 450 then determines which, if any, of the sub-strings 411, 412, 413 should be bypassed by the sub-string bypass switches 441, 442, 443.

Figure 4D:
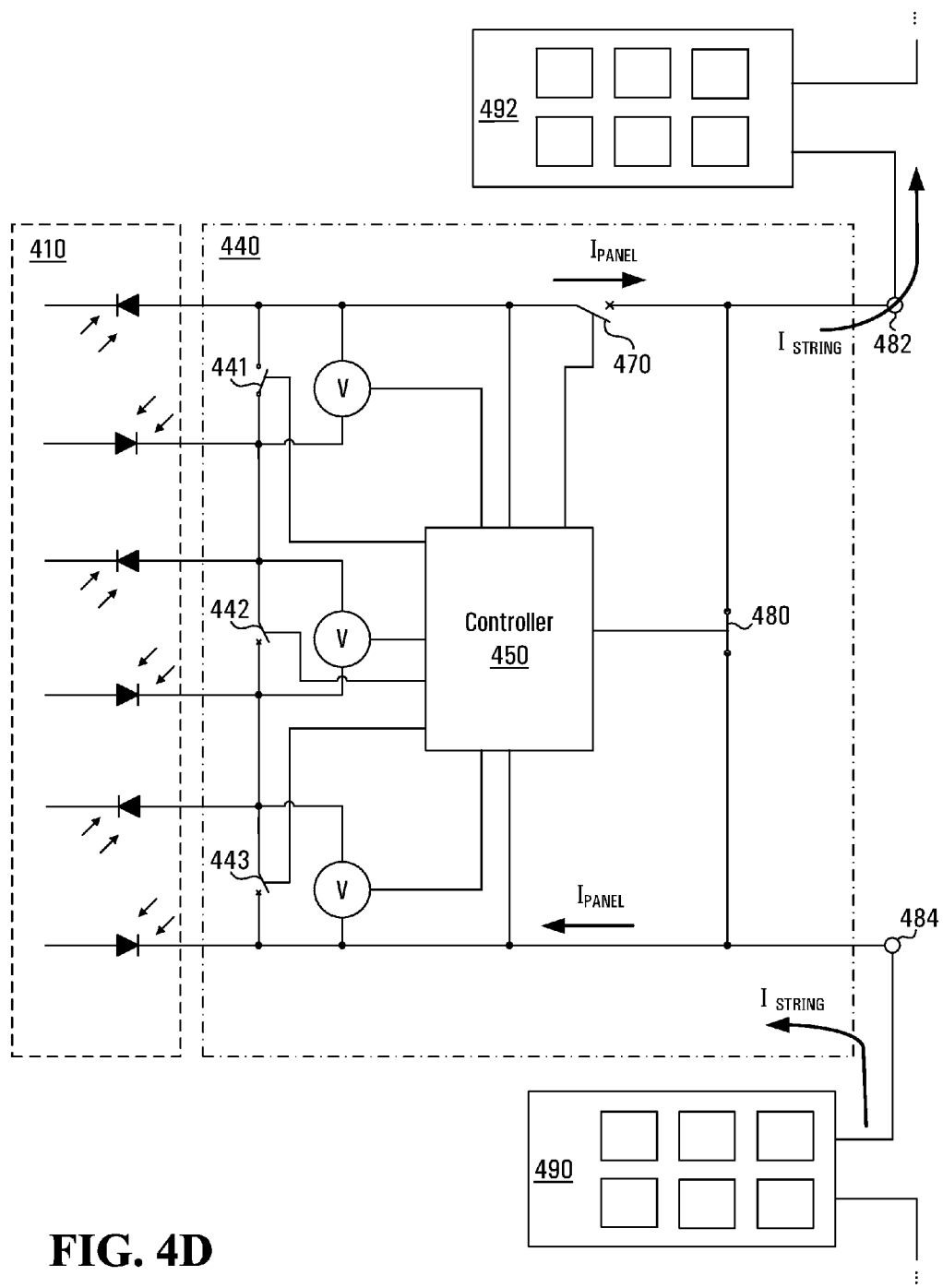
FIG. 4D is a schematic diagram showing the string current and panel currents flowing in a PV panel in an example power system.

In another embodiment of a wake-up operation, the controller 450 closes panel series switch 470 and determines the voltage across panel shunt switch 480, using voltage sensors 461, 462, 463 or an integrated voltage sensor or measurement capability. The controller 450 opens panel shunt switch 480 if the voltage is greater than a threshold value. FIG. 4D is a schematic diagram showing the string current and panel currents flowing in a PV panel in an example power system. The current flowing in panel shunt switch 480 is the difference between the string current $I_{STRING}$ and the panel current $I_{PANEL}$. When the voltage across panel shunt switch 480 is less than zero, this indicates that the string current is greater than the panel current. When the voltage across panel shunt switch 480 is zero, this indicates that the string current and panel current are equal. When the voltage across panel shunt switch 480 is positive, this indicates that the panel current is larger than string current With panel shunt switch 480 closed, the panel current is substantially equal to the short circuit current of the PV panel 410. The corresponding PV panel voltage at the short circuit current is zero. Thus, in one embodiment, the controller 450 opens panel shunt switch 480 and unshunts the PV panel 410 when the voltage across panel shunt switch 480 is greater than zero. Under these conditions, the panel voltage of the unshunted PV panel 410 will be greater than zero and the PV panel will contribute power to the power system.

Figure 4E:
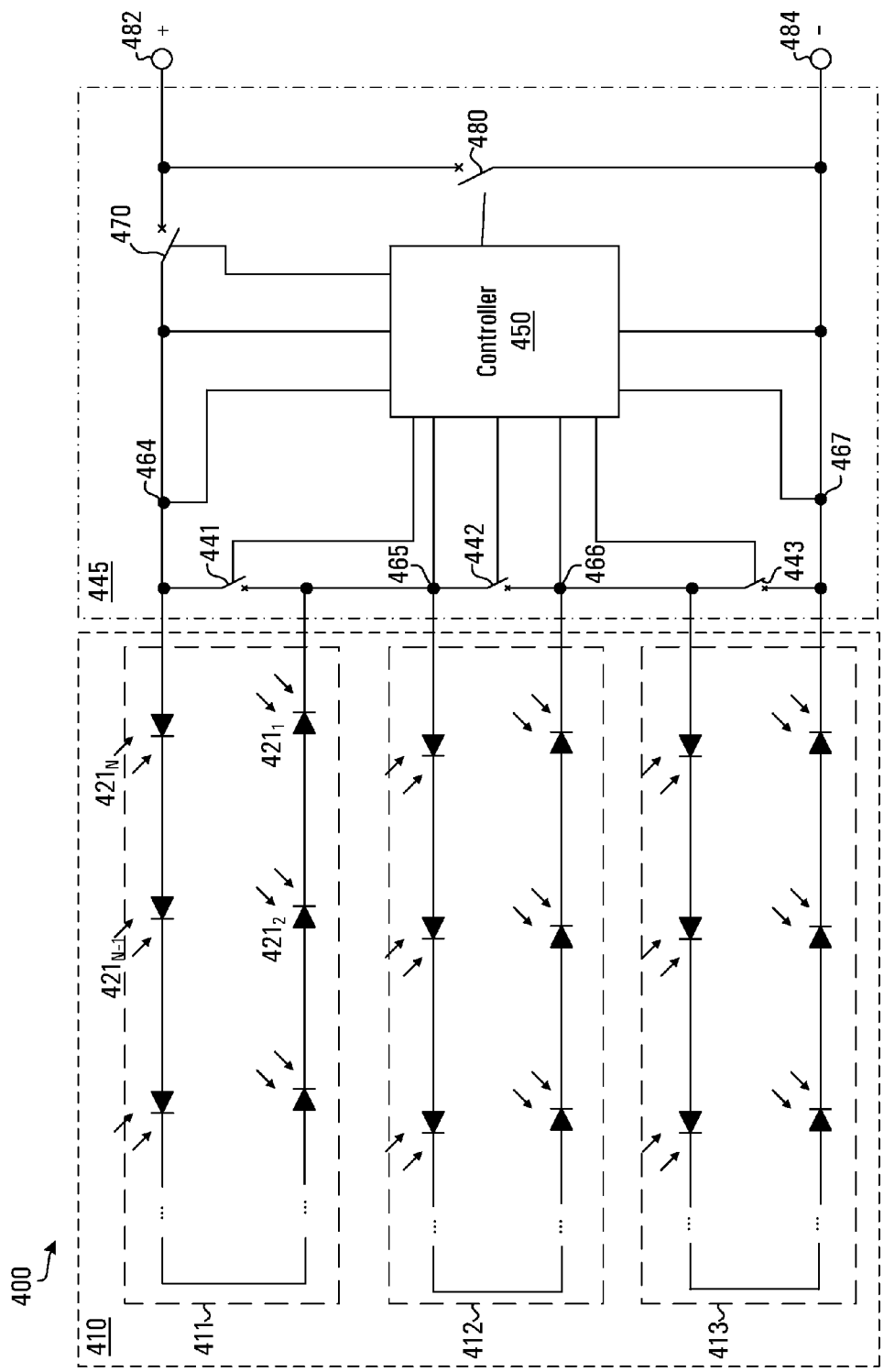
FIG. 4E is a schematic diagram of an example PV panel system which includes a PV panel and another bypass switching arrangement.

FIG. 4E is a schematic diagram of an example PV panel system 400, which includes a PV panel 410 and another bypass switching arrangement 445. In this embodiment voltmeters 461, 462 and 463 (FIGS. 4A, 4B, 4C, 4D) are absent and voltage sensors or a voltage measurement function are incorporated within controller 450. In this embodiment, the controller 450 measures the sub-string voltages through connections to voltage measuring points 464, 465, 466 and 467. In this embodiment, the voltage across a single sub-string, the voltage across two sub-strings in series, and/or the voltage across all sub-strings may be measured by connecting to the appropriate voltage sensing points using a switching means such as multiple controllable switches in the controller 450 or its connections to the voltage measuring points 464, 465, 466 and 467. For example, the combined voltage across sub-strings 411 and 412 may be measured between measurement points 464 and 466 or the combined voltage of all sub-strings may be measured between voltage sensing points 464 and 467. A similar arrangement could be used to measure the voltage across panel shunt switch 480 for the purposes of determining whether the PV panel 410 should be unshunted. Thus, voltage sensing or measurement could be performed by separate voltage sensors 461, 462, 463 as shown in FIGS. 4A to 4D, or by the controller 450 itself as shown in FIG. 4E. The controller 450 might therefore determine a voltage by receiving a measured voltage from a voltage sensor or by measuring the voltage.

Figure 5:
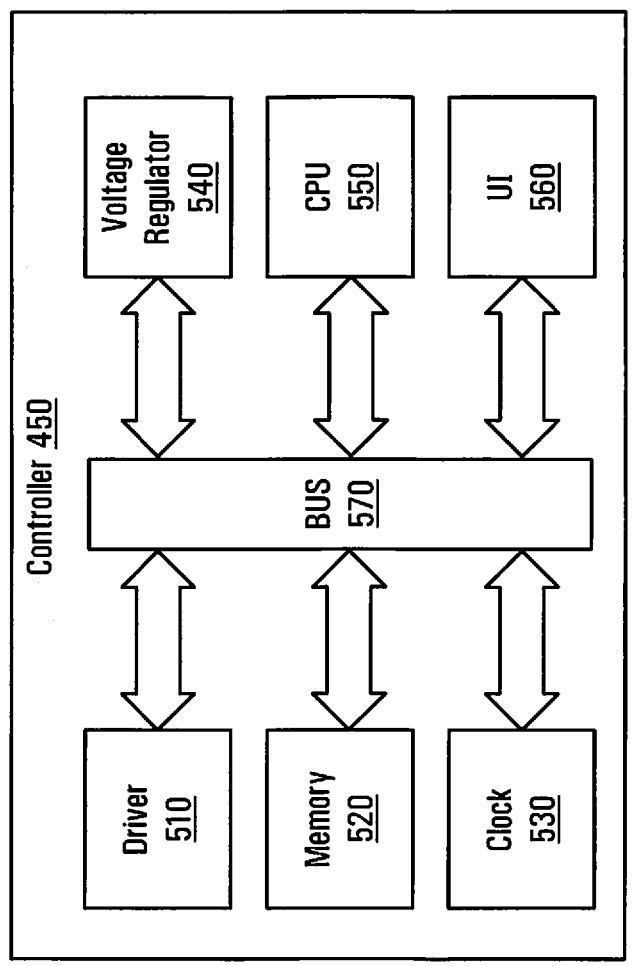
FIG. 5 is a block diagram of an example controller.

FIG. 5 is a block diagram an example controller 450. A voltage regulator 540 converts variable PV panel output voltage to a constant controller supply voltage in an embodiment. A driver 510 supplies drive signals to the sub-string bypass switches 441, 442, 443 and to switches 470 and 480 (FIGS. 4A and 4B) to control their opening and closing. Firmware for the operation of the example controller 450 is stored in memory 520. In one embodiment, the memory 520 is non-volatile memory such as Flash, Electrically Erasable Programmable Read Only Memory (EEPROM), EPROM, ROM. The firmware is executed on a Central Processing Unit (CPU) 550 in the example shown. A clock 530 controls the internal timing of the controller operation. A user Interface (UI) 560 is provided, for example, to communicate the operating status of the bypass switching arrangement to a user. These components are interconnected with each other by control and data bus 570 as shown, in an embodiment.

In one embodiment, the UI 560 consists of Light Emitting Diodes (LEDs) which indicate the state (open or closed) of switches 441, 442, 443, 470, 480 (FIGS. 4A to 4E) by their color and illumination. In another embodiment, the LEDs indicate a fault within a sub-string 411, 412, 413 or the PV panel 410 (FIGS. 4A to 4E), such as an open circuit in a sub-string. In another embodiment, the LEDs indicate the bypass switch state (no sub-strings bypassed, one bypassed, two bypassed, all bypassed).

Basic operation of a PV panel bypass switching arrangement is described above. Additional features could be provided in some embodiments to accommodate certain operating conditions.

Figure 6A:
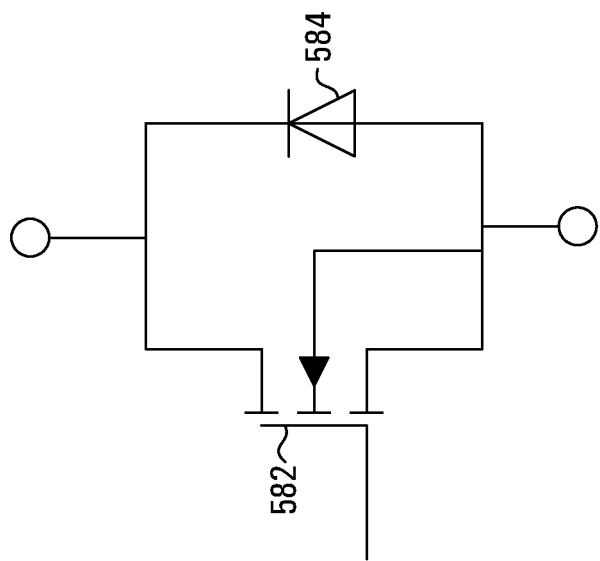
FIGS. 6A and 6B are schematic diagrams of example controllable switches.
Figure 6B:
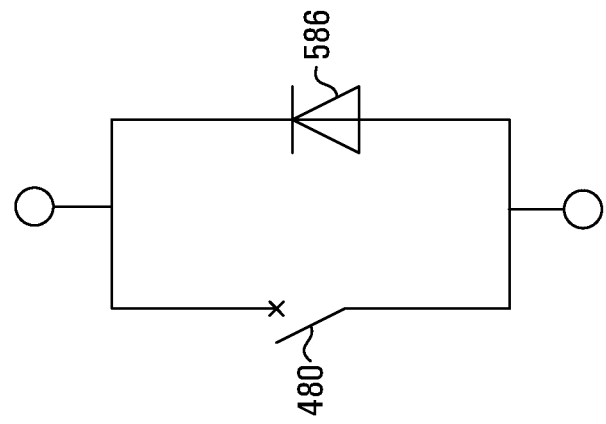

In some situations of extremely weak or no illumination, the example PV panel 410 might not be able to generate sufficient power to operate the controller 450. To provide for this eventuality, in one embodiment, the panel shunt switch 480 is implemented using a power MOSFET. A power MOSFET has a naturally occurring "built-in" diode formed between the MOSFET's body and drain. FIG. 6A is a schematic diagram of a power MOSFET as an example controllable switch. The example in FIG. 6A is an N type MOSFET 582, and its built-in diode is separately shown at 584. The built-in diode 584 is across the MOSFET source and drain terminals (i.e., in parallel with the main conduction path of the MOSFET 582). In the event that the controller 450 does not have enough power to drive the MOSFET 582 into conduction, the built-in diode 584 will become forward biased. The built-in diode 584 will conduct the string current and shunt the PV panel when the example MOSFET of FIG. 6A is implemented as the panel shunt switch 480 (FIGS. 4A to 4E). In another embodiment, a discrete diode is placed in parallel with the panel shunt switch 480 and performs in a similar fashion. FIG. 6B is a schematic diagram of such a controllable switch, including a panel shunt switch 480 with a parallel diode 586.

Regarding a wake-up process as described above, the voltage that is supplied to the controller 450 during this wake-up process could fluctuate significantly if the PV panel 410 is heavily shaded and/or operating under other non-optimal conditions. For instance, in FIG. 4C, with the panel series switch 470 open and the panel shunt switch 480 closed, the PV panel 410 is essentially open circuited and its voltage could be tens of volts, even if it is heavily shaded or otherwise subjected to relatively low illumination. When the panel series switch 470 closes and the panel shunt switch 480 opens, the string current is forced through the PV panel 410. If the PV panel 410 is still heavily shaded, for instance, then the panel voltage will drop rapidly, perhaps to below the minimum operating voltage of the controller 450 ($V_{MIN}$). In one embodiment, the voltage supplied to the controller is stabilized against fluctuations from unshunting the panel.

Figure 7A:
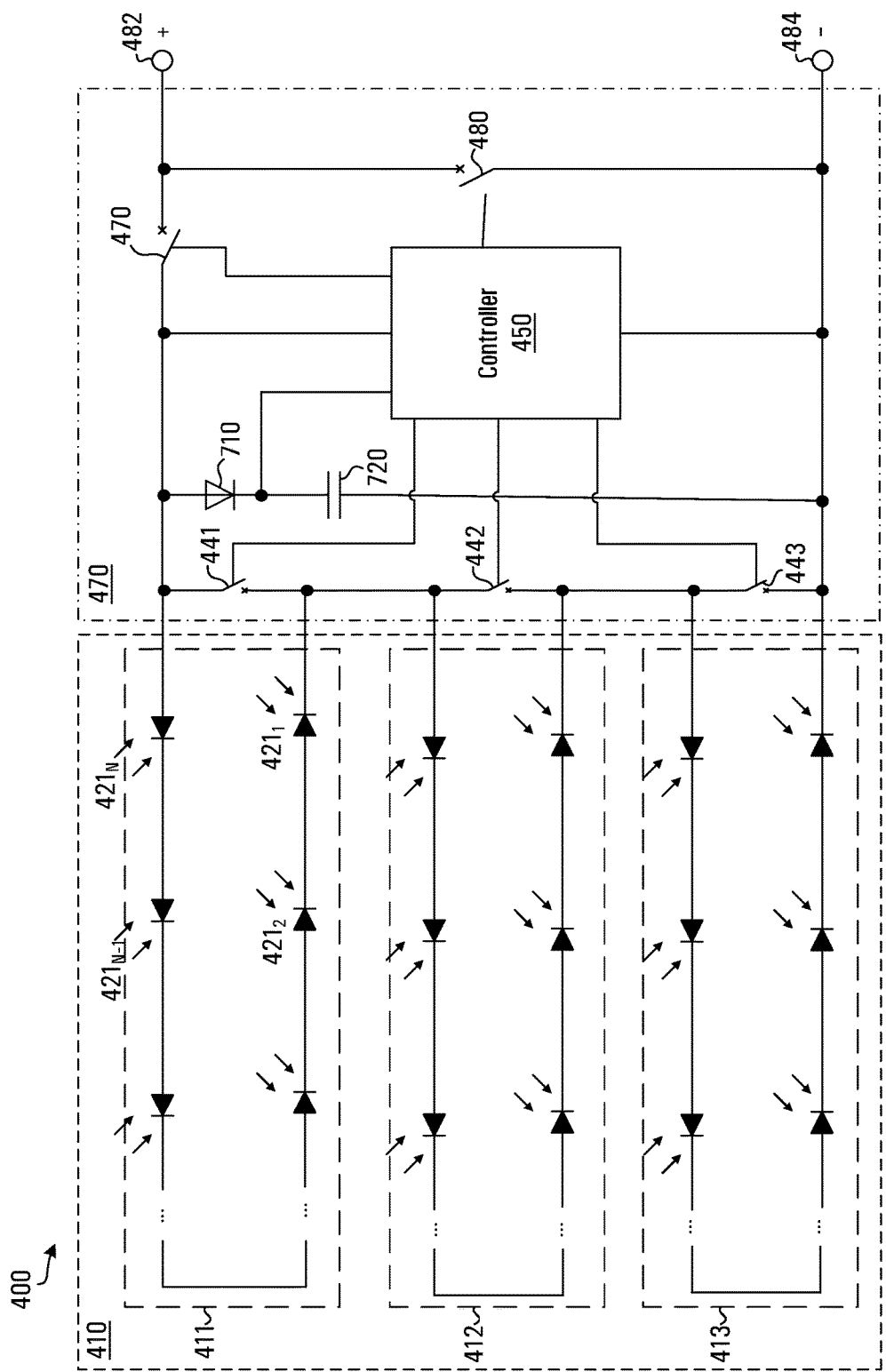
FIG. 7A is a schematic diagram of another example PV panel system.

FIG. 7A is a schematic diagram of another example PV panel system 700, which incorporates an embodiment of controller voltage supply stabilization. The voltage sensors 461, 462, 463 (FIGS. 4A to 4D) have not been shown in FIG. 7A in order to avoid congestion in the drawing. A diode 710 and a capacitor 720 are connected in a circuit path across the circuit path of the PV panel in which the PV cells are connected. The controller 450 receives a supply voltage from the capacitor 720. The capacitor 720 is charged, through the diode 710, to the PV panel output voltage while the PV panel 410 is shunted. If the PV panel output voltage falls when the panel shunt switch 480 is opened and the panel series switch 470 is closed due to string current being forced through the sub-strings 411, 412, 413, then the diode 710 will become reverse biased and prevent the capacitor 720 from discharging. The voltage supplied to the controller 450 will therefore remain relatively constant and only decrease as the controller draws current from the capacitor 720. The capacitor 720 is sized such that it can supply sufficient power to the controller 450 for the controller to complete the wake-up operation.

In another embodiment, the voltage stabilization circuit is used to harvest additional power from the PV panel 410. A PV panel conducting the string current continues to supply power to the power system so long as its voltage remains positive. In some situations, the PV panel voltage may still be positive but less than the voltage needed to supply the controller 450. Bypassing the PV panel 410 while its voltage is still positive, in order to ensure that the controller has it minimum operating voltage, would result in lost power.

Figure 7B:
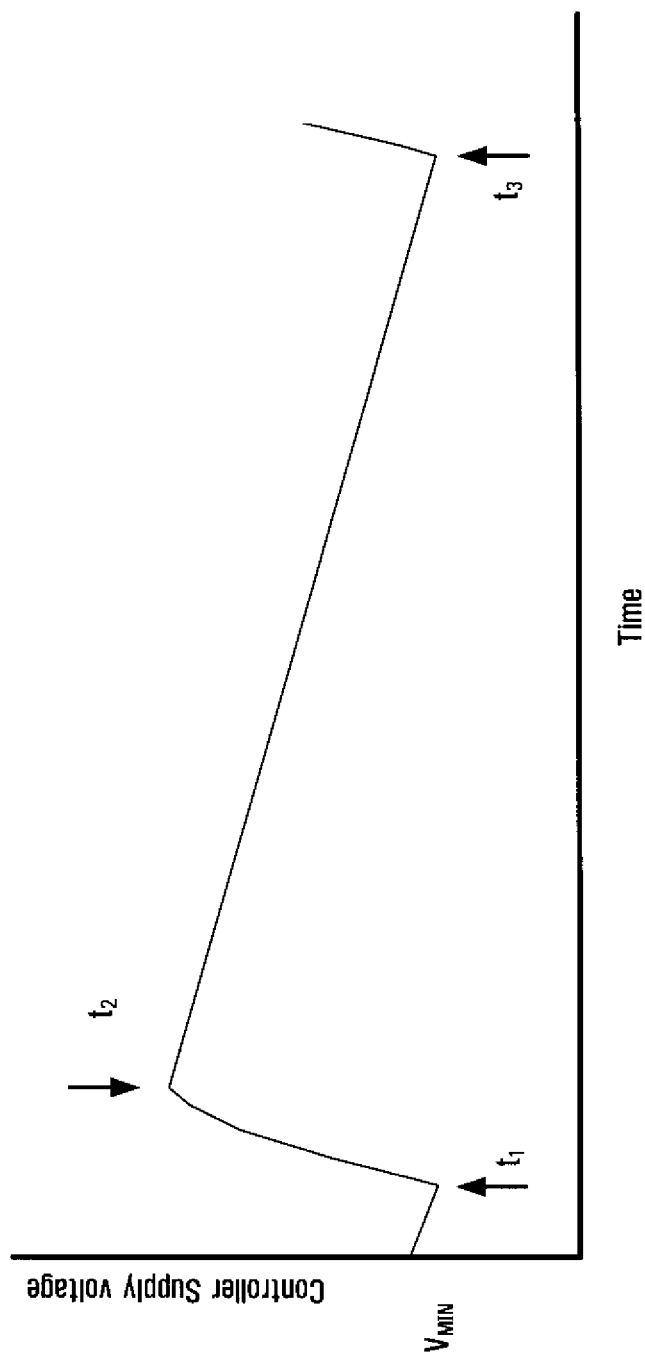
FIG. 7B is an example plot of controller supply voltage versus time.

In one embodiment, controller 450 monitors the value of the voltage on capacitor 720. FIG. 7B is an example plot of the voltage of the supply capacitor 720 versus time. At time $t_1$ the capacitor voltage becomes equal to a minimum voltage $V_{MIN}$ and controller 450 opens switches 470, 441, 442 and 443 and closes switch 480. This disconnects PV panel 410 from the string and the PV panel voltage will rise to the open circuit voltage of the PV panel. Even under heavily shaded or otherwise reduced insolation conditions, the open circuit voltage of the PV panel 410 can easily be tens of volts. The PV panel voltage will forward bias diode 710 and capacitor 720 will charge to the PV panel voltage less the diode drop across diode 710. Controller 450 opens panel shunt switch 480 and closes panel series switch 470 once capacitor 720 is charged to a sufficient voltage. This occurs at time $t_2$ in FIG. 7B. In one embodiment, this is substantially the PV panel open circuit voltage. The PV panel voltage will drop as the string current passes through it, however it will continue to supply power to the power system as long as its voltage remains positive. Diode 710 becomes reverse biased but capacitor 720 remains charged at the open circuit panel voltage. After time $t_2$ the voltage of capacitor 720 slowly drops as controller 450 continues to operate and draws current. At time $t_3$ in FIG. 7B the voltage of capacitor 720 has again dropped to $V_{MIN}$ and the cycle repeats. The plot shown in FIG. 7B is solely for illustrative purposes. Similar or different voltage/time characteristics could be observed in other embodiments or implementations.

PV panel bypass switching features are disclosed above. With reference again to FIGS. 4A to 4E and 7A, but in a somewhat more general sense, a panel bypass switching arrangement such as 440, 445, 740 could include a first switch 470 and a second switch 480. The first switch 470 is to be coupled between a power system and a first end of a circuit path of a PV panel 410 in which PV cells of the PV panel are connected, and the first switch is controllable to connect the first end of the circuit path of the PV panel to a power system and to disconnect the first end of the circuit path of the PV panel from the power system. The second switch 480 is to be coupled between (i) a point between the first switch 470 and the power system and (ii) a point between a second end of the circuit path of the PV panel 410 and the power system. The second switch 480 is controllable to open and close a bypass circuit path that bypasses the circuit path of the PV panel 410.

A controller 450 is operatively coupled to the first switch 470 and to the second switch 480, to determine whether the circuit path of the PV panel 410 is to be bypassed, and to control the first and second switches based on the determination.

A PV panel bypass switching arrangement could also include a voltage sensor 461, 462, 463, to be coupled to measure a voltage difference across PV cells in the circuit path of the PV panel 410. In the examples shown in FIGS. 4A, 4C and 4D, there are multiple voltage sensors 461, 462, 463, although in other embodiments there could be more or fewer voltage sensors. The controller 450 is coupled to the voltage sensors(s) 461, 462, 463 to determine whether the circuit path of the PV panel 410 is to be bypassed, based on the voltage difference(s) measured by the voltage sensors(s).

In an embodiment, a single voltage sensor is to be switchably coupled between respective voltage measuring points 464, 465, 466, 467 (FIG. 4E) in the circuit path of the PV panel.

As described in detail herein, the controller 450 could determine whether each respective PV cell sub-string 411, 412, 413 in the circuit path of the PV panel 410 is to be bypassed, and to control PV cell sub-string switches 441, 442, 443 that are coupled across the respective PV cell sub-strings, based on the determination.

In some embodiments, a power connection between the controller 450 and the first switch 470 provides power to the controller from the PV panel 410. The power connection could include a voltage stabilization circuit, which in the example shown in FIG. 7A includes the diode 710, with its anode coupled to the first switch 470 and its cathode coupled to a power input of the controller 450, and the capacitance 720 couples the cathode of the diode to the second end of the circuit path of the PV panel 410.

When a PV panel or sub-string has been bypassed, the controller 450 could subsequently determine whether the PV panel or sub-string should be reconnected. For instance, where the controller 450 is configured to open the panel series switch 470 and close the panel shunt switch 480 responsive to determining that the circuit path of the PV panel 410 is to be bypassed, it could subsequently close the panel series switch and open the panel shunt switch and determine whether the PV panel 410 is to be reconnected to the power system based on one or more voltage difference(s) measured by the voltage sensor(s) while the first switch is closed and the second switch is open, and control the first and second switches based on the further determination.

In an embodiment, the controller 450 determines whether the PV panel is to be reconnected to the power system based on a voltage difference across the panel shunt switch 480 while that switch is closed, as described in detail above. For PV cell sub-strings, after a sub-string switch 441, 442, 443 has been closed, the controller 450 could determine whether the PV cell sub-string is to be reconnected based on a voltage difference across the PV cell sub-string switch while the PV cell sub-string switch is closed. In another embodiment, after a PV cell sub-string is bypassed, the controller 450 subsequently opens the PV cell sub-string switch and further determines whether the PV cell sub-string is to be reconnected based on the voltage difference measured across the PV cell sub-string by the voltage sensor while PV cell sub-string switch is open, and to control the PV cell sub-string switch of the PV cell sub-string based on the determination of whether the PV cell sub-string is to be reconnected.

FIGS. 4A to 4E and 7A show the PV panel 410 and the PV panel bypass switching arrangement 440, 445, 740 as separate components. A PV panel system 400, 700 could include both of these components. In some embodiments, the bypass switching arrangement 440, 740 could be integrated into a PV panel. In some embodiments, the bypass switching arrangement could be integrated into a junction box of the PV panel. If the PV panel 410 and the PV panel bypass switching arrangement 440, 445, 740 are manufactured or otherwise provided separately, then components of the PV panel bypass switching arrangement are to be connected or coupled to a PV panel and power system as described herein. In an integrated package or product, or after installation of separately provided components, for example, these connections may already be in place.

Embodiments are disclosed above primarily in the context of example PV panel systems. Other embodiments, including methods for instance, are also contemplated. FIG. 8 is a flow diagram of an example method.

The example method 800 involves determining at 802 whether a circuit path of a PV panel, in which PV cells are connected, is to be bypassed. At 804, a first switch (e.g., 470 in FIGS. 4A to 4E and 7A) coupled between a power system and a first end of the circuit path of the PV panel is controlled, to connect the first end of the circuit path of the PV panel to a power system or to disconnect the first end of the circuit path of the PV panel from the power system based on the determination at 802. The control at 804 also involves controlling, based on the determination at 802, the second switch (e.g., 480 in FIGS. 4A to 4E and 7A) coupled between (i) a point between the first switch and the power system and (ii) a point between a second end of the circuit path of the PV panel and the power system, to open or close a bypass circuit path that bypasses the circuit path of the PV panel. Controlling of the switches at 804 could involve maintaining one or both of the switches in its current open or closed state, and/or changing the state of one or both of the switches.

The example method 800 is illustrative of one embodiment. Examples of additional operations that may be performed, such as measuring voltages, bypassing PV cell sub-strings, and/or reconnecting a bypassed PV panel or PV cell sub-string, will be apparent from the description and drawings relating to apparatus and system implementations, for example. Further variations may be or become apparent.

One such variation relates to voltage stabilization as described herein with reference to FIGS. 7A and 7B. Voltage stabilization could involve opening the panel series switch 470 and closing the panel shunt switch 480 when the capacitor 720 (FIG. 7A) discharges to a first voltage, illustratively the minimum operating voltage of the controller 450, and then charging the capacitor. The diode 710 becomes forward biased, and the capacitor 720 charges to a second voltage above the first voltage. This second voltage could be as high as the PV panel 410 open circuit voltage less the voltage drop across the diode 710. The next stage of voltage stabilization involves closing the panel series switch 470 and opening the panel shunt switch 480 when the capacitor 720 charges to the second voltage. The PV panel 410 could thus be cyclically bypassed, its voltage then rises and charges the capacitor 720, the PV panel 410 is reconnected and the capacitor has enough stored charge to power the controller 450 for some time, and then the cycle repeats again. This mechanism can be quite useful in that it enables "harvesting" of energy while keeping the controller 450 powered even under low output voltage conditions.

FIG. 9 is a flow diagram of another example method 900, which relates to manufacturing, building, and/or installing a PV panel system. The example method 900 involves providing a PV panel at 902. The PV panel includes a circuit path in which PV cells are connected. At 904, switches and a controller are provided. The switches include a first switch (e.g., 470 in FIGS. 4A, 4B, and 7) to switchably connect a first end of the circuit path of the PV panel to a power system, and a second switch (e.g., 480 in FIGS. 4A, 4B, and 7) to switchably connect (i) a point between the first switch and the power system and (ii) a point between a second end of the circuit path and the power system. A controller is provided at 904 to determine whether the circuit path of the PV panel is to be bypassed and to control the first and second switches based on the determination. These illustrative operations relate to manufacturing or building a PV panel system.

Installation of such a PV panel system may be performed at 906 at a later time. During installation, the first switch and the second end of the circuit path of the PV panel are connected to a power system.

The example method 900, like the example method 800, is intended for illustrative purposes, and other embodiments may include variations.

What has been described is merely illustrative of the application of principles of embodiments of the present disclosure. Other arrangements and methods can be implemented by those skilled in the art.

For example, although described primarily in the context of methods and systems, other implementations are also contemplated. At least control features, for instance, could be implemented as instructions stored on a non-transitory computer-readable medium.

We claim:

1. A PhotoVoltaic (PV) panel bypass switching arrangement comprising:
    a first switch to be coupled between a power system and a first end of a circuit path of the PV panel in which a plurality of PV cells of the PV panel are connected, the first switch being controllable to connect the first end of the circuit path of the PV panel to a power system and to disconnect the first end of the circuit path of the PV panel from the power system;
    a second switch to be coupled between (i) a point between the first switch and the power system and (ii) a point between a second end of the circuit path of the PV panel and the power system, the second switch being controllable to open and close a bypass circuit path that bypasses the circuit path of the PV panel;
    a controller operatively coupled to the first switch and to the second switch, to determine whether the circuit path of the PV panel is to be bypassed, and to control the first and second switches based on the determination;
    respective PV cell sub-string switches to be coupled across respective sub-strings of the plurality of PV cells that are connected in the circuit path of the PV panel, the controller being further operatively coupled to the PV cell sub-string switches, to determine whether each respective PV cell sub-string in the circuit path of the PV panel is to be bypassed, and to control the PV cell sub-string switches based on the determination of whether each PV cell sub-string in the circuit path of the PV panel is to be bypassed,
    the first switch, the second switch, and the respective PV cell sub-string switches comprising power Metal Oxide Semiconductor Field Effect Transistors (MOSFETS),
    the PV panel bypass switching arrangement further comprising:
    a power connection between the controller and the PV panel, to provide power to the controller from the PV panel, the power connection comprising a voltage stabilization circuit, the voltage stabilization circuit comprising:
        a diode, an anode of the diode being coupled to the PV panel and a cathode of the diode being coupled to a power input of the controller;
        a capacitor to couple the cathode of the diode to the second end of the circuit path of the PV panel.

2. The PV panel bypass switching arrangement of claim 1, further comprising:
    a voltage sensor, to be coupled to measure a voltage difference across PV cells in the circuit path of the PV panel, the controller being coupled to the voltage sensor to determine whether the circuit path of the PV panel is to be bypassed based on the voltage difference measured by the voltage sensor.

3. The PV panel bypass switching arrangement of claim 1, further comprising:
a voltage sensor, to be switchably coupled between respective pairs of voltage measuring points in the circuit path of the PV panel between which the respective sub-strings of the plurality of PV cells are connected, to measure respective voltage differences between the respective voltage measuring points,
the controller being coupled to the voltage sensor to determine whether the circuit path of the PV panel is to be bypassed based on the voltage differences measured by the voltage sensor.

4. The PV panel bypass switching arrangement of claim 1, the controller being configured to further determine, subsequent to determining that the circuit path of the PV panel is to be bypassed, whether the PV panel is to be reconnected to the power system, and to further control the first and second switches based on the further determination.

5. The PV panel bypass switching arrangement of claim 3,
the controller being configured to open the first switch and close the second switch responsive to determining that the circuit path of the PV panel is to be bypassed,
the controller being further configured to subsequently close the first switch and open the second switch and to further determine whether the PV panel is to be reconnected to the power system based on the voltage differences measured by the voltage sensor while the first switch is closed and the second switch is open,
the controller being further configured to control the first and second switches based on the further determination.

6. The PV panel bypass switching arrangement of claim 3,
the controller being configured to open the first switch and close the second switch responsive to determining that the circuit path of the PV panel is to be bypassed,
the controller being further configured to subsequently determine whether the PV panel is to be reconnected to the power system based on a voltage difference across the second switch while the second switch is closed, and to control the first and second switches based on the determination of whether the PV panel is to be reconnected to the power system.

7. The PV panel bypass switching arrangement of claim 1,
the controller being configured to, responsive to determining that a PV cell sub-string in the circuit path of the PV panel is to be bypassed, close the PV cell sub-string switch that is coupled across the PV cell sub-string,
the controller being further configured to determine, subsequent to determining that the PV cell sub-string is to be bypassed, whether the PV cell sub-string is to be reconnected based on a voltage difference across the PV cell sub-string switch while the PV cell sub-string switch is closed, and to control the PV cell sub-string switch of the PV cell sub-string based on the determination of whether the PV cell sub-string is to be reconnected.

8. The PV panel bypass switching arrangement of claim 1,
the controller being configured to, responsive to determining that a PV cell sub-string in the circuit path of the PV panel is to be bypassed, close the PV cell sub-string switch that is coupled across the PV cell sub-string,
the controller being further configured to subsequently open the PV cell sub-string switch and to further determine whether the PV cell sub-string is to be reconnected based on a voltage difference across the PV cell sub-string while PV cell sub-string switch is open, and to control the PV cell sub-string switch of the PV cell sub-string based on the determination of whether the PV cell sub-string is to be reconnected.

9. A PhotoVoltaic (PV) panel system comprising:
the PV panel bypass switching arrangement of claim 1;
a PV panel comprising the plurality of PV cells connected in the circuit path.

10. A power system comprising:
a plurality of PV panel systems according to claim 9.

11. A method comprising:
determining whether a circuit path of a PhotoVoltaic (PV) panel, in which a plurality of PV cells of the PV panel are connected, is to be bypassed;
controlling a first switch coupled between a power system and a first end of the circuit path of the PV panel, to connect the first end of the circuit path of the PV panel to a power system or to disconnect the first end of the circuit path of the PV panel from the power system, based on the determination;
controlling a second switch coupled between (i) a point between the first switch and the power system and (ii) a point between a second end of the circuit path of the PV panel and the power system, to open or close a bypass circuit path that bypasses the circuit path of the PV panel, based on the determination;
determining whether each of respective sub-strings of the plurality of PV cells that are connected in the circuit path of the PV panel is to be bypassed;
controlling respective PV cell sub-string switches coupled across the respective PV cell sub-strings, based on the determination of whether each PV cell sub-string in the circuit path of the PV panel is to be bypassed,
the first switch, the second switch, and the respective PV cell sub-string switches comprising power Metal Oxide Semiconductor Field Effect Transistors (MOSFETS),
the method further comprising:
providing power to a controller from the PV panel;
stabilizing a voltage that is provided to power the controller, the stabilizing comprising:
providing the power to the controller through a stabilization circuit comprising: a diode, an anode of the diode being coupled to the PV panel and a cathode of the diode being coupled to a power input of the controller; and a capacitor to couple the cathode of the diode to the second end of the circuit path of the PV panel.

12. The method of claim 11, further comprising:
measuring a voltage difference across PV cells in the circuit path of the PV panel,
the determining whether the circuit path of the PV panel is to be bypassed comprising determining whether the circuit path of the PV panel is to be bypassed based on the measured voltage difference.

13. The method of claim 11, further comprising:
measuring respective voltage differences across the respective sub-strings of the plurality of PV cells in the circuit path of the PV panel,
the determining whether the circuit path of the PV panel is to be bypassed comprising determining whether the circuit path of the PV panel is to be bypassed based on the measured voltage differences.

14. The method of claim 11, further comprising:
determining, subsequent to determining that the circuit path of the PV panel is to be bypassed, whether the PV panel is to be reconnected to the power system;
further controlling the first and second switches based on the determination of whether the PV panel is to be reconnected to the power system.

15. The method of claim 13,
the controlling of the first switch comprising opening the first switch responsive to determining that the circuit path of the PV panel is to be bypassed,
the controlling of the second switch comprising closing the second switch responsive to determining that the circuit path of the PV panel is to be bypassed,
the method further comprising:
subsequently closing the first switch and opening the second switch;
determining whether the PV panel is to be reconnected to the power system based on the voltage differences measured while the first switch is closed and the second switch is open;
controlling the first and second switches based on the determination of whether the PV panel is to be reconnected to the power system.

16. The method of claim 13,
the controlling of the first switch comprising opening the first switch responsive to determining that the circuit path of the PV panel is to be bypassed,
the controlling of the second switch comprising closing the second switch responsive to determining that the circuit path of the PV panel is to be bypassed,
the method further comprising:
subsequently determining whether the PV panel is to be reconnected to the power system based on a voltage difference across the second switch while the second switch is closed;
controlling the first and second switches based on the determination of whether the PV panel is to be reconnected to the power system.

17. The method of claim 11,
the controlling of the respective PV cell sub-string switches comprising, responsive to determining that a PV cell sub-string in the circuit path of the PV panel is to be bypassed, closing the PV cell sub-string switch that is coupled across the PV cell sub-string,
the method further comprising:
subsequently determining whether the PV cell sub-string is to be reconnected based on a voltage difference across the PV cell sub-string switch while the PV cell sub-string switch is closed;
controlling the PV cell sub-string switch of the PV cell sub-string based on the determination of whether the PV cell sub-string is to be reconnected.

18. The method of claim 11,
the controlling of the respective PV cell sub-string switches comprising, responsive to determining that a PV cell sub-string in the circuit path of the PV panel is to be bypassed, closing the PV cell sub-string switch that is coupled across the PV cell sub-string,
the method further comprising:
subsequently opening the PV cell sub-string switch;
determining whether the PV cell sub-string is to be reconnected to the power system based on a voltage difference across the PV cell sub-string while the PV cell sub-string switch is open;
controlling the PV cell sub-string switch based on the determination of whether the PV cell sub-string is to be reconnected.

19. A method comprising:
determining whether a circuit path of a PhotoVoltaic (PV) panel, in which a plurality of PV cells of the PV panel are connected, is to be bypassed;
controlling a first switch coupled between a power system and a first end of the circuit path of the PV panel, to connect the first end of the circuit path of the PV panel to a power system or to disconnect the first end of the circuit path of the PV panel from the power system, based on the determination;
controlling a second switch coupled between (i) a point between the first switch and the power system and (ii) a point between a second end of the circuit path of the PV panel and the power system, to open or close a bypass circuit path that bypasses the circuit path of the PV panel, based on the determination;
providing power to a controller from the PV panel;
stabilizing a voltage that is provided to power the controller, the stabilizing comprising:
providing the power to the controller through a stabilization circuit comprising: a diode, an anode of the diode being coupled to the PV panel and a cathode of the diode being coupled to a power input of the controller; and a capacitor to couple the cathode of the diode to the second end of the circuit path of the PV panel;
opening the first switch and closing the second switch when the capacitor discharges to a first voltage;
closing the first switch and opening the second switch when the capacitor charges to a second voltage above the first voltage.

20. The method of claim 19, further comprising:
determining whether each of respective sub-strings of the plurality of PV cells that are connected in the circuit path of the PV panel is to be bypassed;
controlling respective PV cell sub-string switches coupled across the respective PV cell sub-strings, based on the determination of whether each PV cell sub-string in the circuit path of the PV panel is to be bypassed.

21. The method of claim 19, wherein the first switch and the second switch comprise power Metal Oxide Semiconductor Field Effect Transistors (MOSFETS).

22. The method of claim 20, further comprising:
opening the respective PV cell sub-string switches when the capacitor discharges to the first voltage.

23. The method of claim 20, wherein the first switch, the second switch, and the respective PV cell sub-string switches comprise power Metal Oxide Semiconductor Field Effect Transistors (MOSFETS).

24. A method comprising:
providing a PhotoVoltaic (PV) panel comprising a circuit path in which a plurality of PV cells are connected;
providing a first switch to switchably connect a first end of the circuit path of the PV panel to a power system;
providing a second switch to switchably connect (i) a point between the first switch and the power system and (ii) a point between a second end of the circuit path of the PV panel and the power system;

providing respective PV cell sub-string switches to be coupled across respective sub-strings of the plurality of PV cells that are connected in the circuit path of the PV panel, providing a controller to determine whether the circuit path of the PV panel is to be bypassed and to control the first and second switches based on the determination, and to determine whether each respective PV cell sub-string in the circuit path of the PV panel is to be bypassed and to control the PV cell sub-string switches based on the determination of whether each PV cell sub-string in the circuit path of the PV panel is to be bypassed, the first switch, the second switch, and the respective PV cell sub-string switches comprising power Metal Oxide Semiconductor Field Effect Transistors (MOSFETS), the method further comprising:

providing power to the controller from the PV panel;

stabilizing a voltage that is provided to power the controller, the stabilizing comprising:

providing the power to the controller through a stabilization circuit comprising: a diode, an anode of the diode being coupled to the PV panel and a cathode of the diode being coupled to a power input of the controller; and a capacitor to couple the cathode of the diode to the second end of the circuit path of the PV panel.

* * * * *